United States Patent
Kuan et al.

(10) Patent No.: US 10,069,577 B1
(45) Date of Patent: Sep. 4, 2018

(54) I/Q IMBALANCE CALIBRATION APPARATUS, METHOD AND TRANSMITTER SYSTEM USING THE SAME

(71) Applicant: NATIONAL CHUNG SHAN INSTITUTE OF SCIENCE AND TECHNOLOGY, Taoyuan (TW)

(72) Inventors: Yen-Cheng Kuan, Kaohsiung (TW); Hung-Ting Chou, New Taipei (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

(21) Appl. No.: 15/848,002

(22) Filed: Dec. 20, 2017

(51) Int. Cl.
| | |
|---|---|
| H04L 25/03 | (2006.01) |
| H04B 17/11 | (2015.01) |
| H04L 27/36 | (2006.01) |
| H04L 27/26 | (2006.01) |
| H04L 27/38 | (2006.01) |
| H03D 3/00 | (2006.01) |
| H04B 1/408 | (2015.01) |

(52) U.S. Cl.
CPC ............ *H04B 17/11* (2015.01); *H03D 3/009* (2013.01); *H04B 1/408* (2013.01); *H04L 27/2626* (2013.01); *H04L 27/2647* (2013.01); *H04L 27/364* (2013.01); *H04L 27/3809* (2013.01); *H04L 27/3863* (2013.01)

(58) Field of Classification Search
CPC .......... G06F 19/00; H03D 3/009; H03M 1/06; H04B 1/04; H04B 1/16; H04B 1/38; H04B 1/408; H04B 7/00; H04B 17/11; H04L 1/02; H04L 25/03; H04L 27/364; H04L 27/2647; H04L 27/3809; H04L 27/3863; H04L 29/14
USPC ..... 330/2, 129, 136, 149; 341/118; 375/141, 375/219, 221, 267, 295–297, 345; 455/67.11, 114.2, 126, 205, 517, 522; 702/106
See application file for complete search history.

(56) References Cited

U.S. PATENT DOCUMENTS

2004/0224715 A1* 11/2004 Rosenlof .............. H03G 3/3042
455/522
2005/0075815 A1* 4/2005 Webster ................. H03C 3/406
702/106

(Continued)

*Primary Examiner* — Shawkat M Ali
(74) *Attorney, Agent, or Firm* — Schmeiser, Olsen & Watts, LLP

(57) ABSTRACT

An I/Q imbalance calibration method includes sequentially inputting a first in-phase and quadrature signals calibration signal to a front-end circuit of the transmitter system to acquire and estimate a first and second calibration signal strengths sequentially, wherein a delta estimation is adopted; calculating an I/Q gain imbalance according to estimated first and second calibration signal strengths; sequentially inputting a second in-phase calibration signal and both of the second in-phase and quadrature calibration signal to the front-end circuit of the transmitter system to acquire and estimate a third and fourth calibration signal strengths sequentially, wherein an I/Q gain imbalance compensation is formed on the first in-phase and quadrature calibration signals to generate the second in-phase and quadrature calibration signals; and calculating an I/Q phase imbalance according to estimated third and fourth calibration signal strengths.

14 Claims, 3 Drawing Sheets

(56) References Cited

U.S. PATENT DOCUMENTS

| | | | |
|---|---|---|---|
| 2007/0298733 A1* | 12/2007 | Cole | H04B 17/101 455/114.2 |
| 2008/0063113 A1* | 3/2008 | Gao | H04L 25/061 375/296 |
| 2008/0143562 A1* | 6/2008 | Huang | H04L 27/364 341/118 |
| 2016/0323010 A1* | 11/2016 | Wu | H04B 1/44 |

* cited by examiner

I/Q IMBALANCE CALIBRATION APPARATUS, METHOD AND TRANSMITTER SYSTEM USING THE SAME

FIELD OF THE INVENTION

The present disclosure relates to a transmitter system, and in particular to an in-phase/quadrature (I/Q) imbalance calibration apparatus, method and transmitter using the same.

BACKGROUND OF THE INVENTION

In the transmitter system, the baseband signal is processed with digital-analog conversion, low pass filtering, local oscillating (LO) signal mixing, in-phase and quadrature signal combination, band pass filtering and the intermediate frequency (IF) signal mixing, so as to generate a radio frequency (RF) signal. These processions can be implemented by a plurality of circuits, and the in-phase and quadrature baseband signals processed by the circuits of in-phase and quadrature channels (I and Q channels) may have offset due to the semiconductor process variations. The offset is named I/Q imbalance, and a calibration or correction should be done to deal with the I/Q imbalance (comprising I/Q gain and phase imbalances).

The analog-digital converter (ADC) can be used to sample the processed RF signal for calibration of I/Q imbalance, and the sampling rate of the ADC should be larger than the signal bandwidth of the RF signal. However, for the transmitter system adopting the communication band of the millimeter wave, the signal bandwidth is ultra large, for example several giga hertz (GHz), and thus the ADC should have the sampling rate of several giga bits per second (Gb/s). It is a challenge for designing an ultra-high sampling rate ADC, and even the ultra-high sampling rate ADC can be designed well, the large power consumption due to the ultra-high sampling rate effects the heat dissipation of the transmitter system.

SUMMARY OF THE INVENTION

An objective of the present disclosure is to provide an I/Q imbalance calibration apparatus and method which can estimate and compensate the gain imbalance and the phase imbalance of the I and Q channels (i.e. I/Q gain and phase imbalances) without using the ultra-high sampling rate ADC, such that the cost and power consumption can be reduced.

Another one objective of the present disclosure is to provide a transmitter system which uses the I/Q imbalance calibration apparatus or method for the application of the millimeter wave communication band, such as $5^{th}$ generation mobile communication system.

To achieve at least the above objective, the present disclosure provides an I/Q imbalance calibration apparatus used in a transmitter system operated in an I/Q imbalance calibration mode, comprising: a calibration signal generator, used to selectively generate a first in-phase calibration signal, a first quadrature calibration signal, or both of the first in-phase and quadrature calibration signals; an I/Q imbalance calibrator, electrically connected to the calibration signal generator, used to perform a I/Q gain imbalance compensation on the first in-phase and quadrature calibration signals to generate a second in-phase and quadrature calibration signals after receiving an I/Q gain imbalance, and selectively output the first in-phase calibration signal, the first quadrature calibration signal, the second in-phase calibration signal or both of the second in-phase and quadrature calibration signals to a front-end circuit of the transmitter system; a signal strength acquiring circuit, electrically connected to the front-end circuit of the transmitter system, used to selectively acquire and output one of a first through fourth calibration signal strengths, wherein the first through fourth calibration signal strengths are corresponding to a first through fourth calibration signals respectively, and the first through fourth calibration signals are processed signals which the front-end circuit processes the first in-phase calibration signal, the first quadrature calibration signal, the second in-phase calibration signal and both of the second in-phase and quadrature calibration signals respectively; and an I/Q imbalance estimator, electrically connected to the signal strength acquiring circuit, used to selectively estimate one of the first through fourth calibration signal strengths by a delta estimation, calculate the I/Q gain imbalance according to an estimated first and second calibration signal strengths, calculate an I/Q phase imbalance according to an estimated third and fourth calibration signal strengths; wherein the signal acquiring circuit comprises: a square calculation circuit, electrically connected to the front-end circuit, used to perform a square calculation on received one of the first through fourth calibration signals; and a low pass filter, electrically connected to the square calculation circuit and the I/Q imbalance estimator, used to perform low pass filtering on squared one of the first through fourth calibration signals, so as to generate one of the first through fourth calibration signal strengths; wherein the I/Q imbalance estimator comprises: a delta estimator, electrically connected to the signal strength acquiring circuit, used to generate a reference signal strength according to an accumulated data signal, compare the reference signal strength with one of the first through fourth calibration signal strengths, and the accumulated data signal is gradually incremented until the reference signal strength is approximate to and not less than the one of the first through fourth calibration signal strengths; and a controller, electrically connected to the delta estimator, the I/Q imbalance calibrator and the calibration signal generator, used to calculate the I/Q gain imbalance according to the estimated first and second calibration signal strengths, calculate the I/Q phase imbalance according to the estimated third and fourth calibration signal strengths.

To achieve at least the above objective, the present disclosure provides a transmitter system comprises the front-end circuit and the I/Q imbalance calibration apparatus.

To achieve at least the above objective, the present disclosure provides I/Q imbalance calibration method used in the transmitter system operated in the I/Q imbalance calibration mode.

In one embodiment of the present disclosure, a calculation of the I/Q phase imbalance is performed after a calculation of the I/Q gain imbalance, the I/Q gain imbalance is transmitted to the I/Q imbalance calibrator to set an I/Q gain imbalance compensation after the I/Q gain imbalance is calculated, and the I/Q phase imbalance is transmitted to the I/Q imbalance calibrator to set an I/Q phase imbalance compensation after the I/Q phase imbalance is calculated.

In one embodiment of the present disclosure, the delta estimator comprises: a DAC, electrically connected to the controller, used to receive the accumulated data signal generated from the controller according to an accumulated signal, and the DAC is triggered by a first clock signal from the controller to perform digital-analog conversion on the accumulated data signal to generate the reference signal strength; a comparator, electrically connected to signal strength acquiring circuit and the DAC, used to compare the reference signal strength with one of the first through fourth calibration signal strengths, output a delta signal when the reference signal strength is less than the one of the first through fourth calibration signal strengths, and output zero when the reference signal strength is not less than the one of the first through fourth calibration signal strengths; a delay unit; and an adder, electrically connected to the delay unit and the comparator, wherein the delay unit is triggered by a second clock signal from the controller to delay the accumulated signal output from the adder, and the adder adds an output signal of the delay unit and an output signal of the comparator to generate the accumulated signal.

In one embodiment of the present disclosure, an accumulated data signal corresponding to the estimated first calibration signal strength is denoted as $M_0$, an accumulated data signal corresponding to the estimated second calibration signal strength is denoted as $M_1$, the I/Q gain imbalance is denoted as $\Delta G$, and $\Delta G=SQRT(M_1/M_0)-1$ (i.e. $\Delta G=(M_1/M_0)^{1/2}-1$); wherein an accumulated data signal corresponding to the estimated third calibration signal strength is denoted as $K_0$, an accumulated data signal corresponding to the estimated fourth calibration signal strength is denoted as $K_1$, the I/Q phase imbalance is denoted as $\Delta\theta$, and $\Delta\theta=\sin^{-1}\{[1-(K_1/2K_0)]\}$.

To sum up, the provided I/Q imbalance calibration apparatus have the advantages of the lower cost, the lower power consumption and lower hardware complexity, and the provided the transmitter system using the provided I/Q imbalance calibration apparatus and method can adopt the communication band of the millimeter wave.

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

An embodiment of the present disclosure provides an I/Q imbalance calibration apparatus and method which can compensate the I/Q gain and phase imbalances without using an ultra-high sampling rate ADC, wherein the DAC is used in the present disclosure, which can have a low sampling rate and low complexity.

The provided I/Q imbalance calibration apparatus and method can be used in a transmitter system, in particular, in a transmitter system adopting the communication band of the millimeter wave. Before data signals are sent, the transmitter system is operated in a I/Q imbalance calibration mode. After the I/Q imbalance calibration mode has been completed, the transmitter system is operated in a normal mode to send the data signals.

In the I/Q imbalance calibration mode, firstly, merely a first in-phase calibration signal is input into an in-phase channel (I channel) to generate a first calibration signal, and a delta estimation is used to estimate the first calibration signal strength; then, merely a first quadrature calibration signal is input into a quadrature channel (Q channel) to generate a second calibration signal, and the delta estimation is used to estimate the second calibration signal strength. The I/Q gain imbalance can be compensated according to the estimated first and second calibration signal strengths.

Next, merely a second in-phase calibration signal is input into the I channel to generate a third calibration signal, and the delta estimation is used to estimate the third calibration signal strength, wherein the I/Q gain imbalance compensation is performed on the first in-phase calibration signal to generate the second in-phase calibration signal. Next, both of second in-phase and quadrature calibration signals are input into the I and Q channels respectively to generate a fourth calibration signal, and the delta estimation is used to estimate the fourth calibration signal strength, wherein the I/Q gain imbalance compensation is performed on the first quadrature calibration signal to generate the second quadrature calibration signal. The I/Q phase imbalance can be compensated according to the estimated third and fourth calibration signal strengths.

Figure 1:
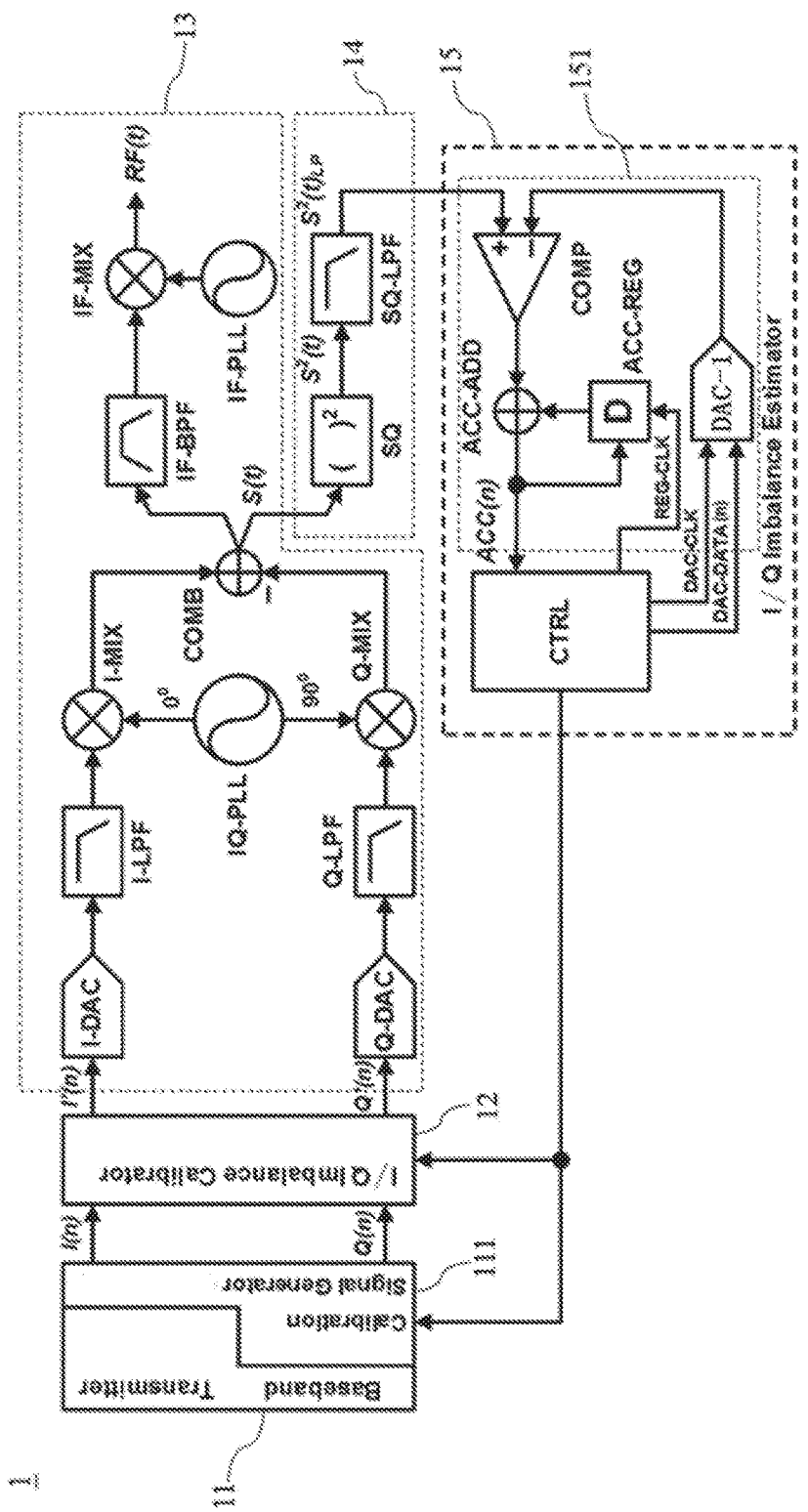
FIG. 1 is a block diagram of a transmitter system having an I/Q imbalance calibration apparatus according to one embodiment of the present disclosure.

Next, referring to FIG. 1, FIG. 1 is a block diagram of a transmitter system having an I/Q imbalance calibration apparatus according to one embodiment of the present disclosure. The transmitter system 1 comprises a baseband transmitter 11, an I/Q imbalance calibrator 12, a front-end circuit 13, a signal strength acquiring circuit 14 and an I/Q imbalance estimator 15. The baseband transmitter 11 is electrically connected to the I/Q imbalance calibrator 12, and the front-end circuit 13 is electrically connected to the I/Q imbalance calibrator and the signal strength acquiring circuit 14. The I/Q imbalance estimator 15 is electrically connected to the baseband transmitter 11, the I/Q imbalance calibrator 12 and the signal strength acquiring unit 14.

The baseband transmitter 11 has a calibration signal generator 111 which is used to transmit the first in-phase and/or quadrature calibration signal to the I/Q imbalance calibrator 12 when the transmitter system 1 is operated in the I/Q imbalance calibration mode. When the transmitter system 1 is operated in the normal mode, the calibration signal generator 111 is disabled, and the baseband transmitter 11 transmits an in-phase and quadrature data signals to the I/Q imbalance calibrator 12. It is noted that the calibration signal generator 111, the I/Q imbalance calibrator 12, the signal strength acquiring unit 14 and the I/Q imbalance estimator 15 form a I/Q imbalance calibration apparatus of the transmitter system 1.

In both of the normal and I/Q imbalance calibration modes, the I/Q imbalance calibrator 12 receives the output signals I(n) and Q(n) from the baseband transmitter 11, and performs I/Q gain imbalance compensation and I/Q phase imbalance compensation on the received signals I(n) and Q(n) to generate signals I'(n) and Q'(n) respectively to the I and Q channels of the front-end circuit 13 respectively.

In both of the normal and I/Q imbalance calibration modes, the I channel of front-end circuit 13 generally performs digital-analog conversion, low pass filtering and in-phase LO signal mixing on the signal I'(n), the Q channel of the front-end circuit 13 generally performs digital-analog conversion, low pass filtering and quadrature LO signal mixing on the signal Q'(n), and then, the front-end circuit 13 combines the processed signals from the I and Q channels to output a signal S(t) to the signal strength acquiring circuit 14. It is noted that the front-end circuit 13 may further perform band pass filtering and (IF) signal mixing on the signal S(t) to generate a radio frequency signal RF(t) when the transmitter system 1 is operated in the normal mode.

The signal strength acquiring circuit 14 is enabled in the I/Q imbalance calibration mode, and performs a square calculation and low pass filtering on the signal S(t), so as to generate a signal strength $S^2(t)_{LP}$.

The I/Q imbalance estimator 15 is enabled in the I/Q imbalance calibration mode, and controls the baseband transmitter 11 to output first in-phase and/or quadrature calibration signals from the calibration signal generator 111 rather than the in-phase and quadrature data signals. The I/Q imbalance estimator 15 can estimate the signal strength $S^2(t)_{LP}$ by a delta estimation, and calculate an I/Q gain imbalance according to the estimated signal strengths related to the first in-phase and quadrature calibration signals without the I/Q gain imbalance compensation. The I/Q imbalance estimator 15 transmits the I/Q gain imbalance to the I/Q imbalance calibrator 12, such that the I/Q imbalance calibrator 12 can accordingly performs the I/Q gain imbalance compensation on the signals I(n) and Q(n).

Furthermore, the I/Q imbalance estimator 15 can calculate an I/Q phase imbalance according to the estimated signal strength related to the first in-phase calibration signal with the I/Q gain imbalance compensation and the estimated signal strength related to both of the first in-phase and quadrature calibration signals with the I/Q gain imbalance compensation. The I/Q imbalance estimator 15 transmits the I/Q phase imbalance to the I/Q imbalance calibrator 12, such that the I/Q imbalance calibrator 12 can accordingly performs the I/Q phase imbalance compensation on the signals I(n) and Q(n).

The above delta estimation is to compare the signal strength $S^2(t)_{LP}$ with a reference signal strength to determine whether the reference signal strength should be incremented or not. When the reference signal strength is approximate to the signal strength $S^2(t)_{LP}$, the reference signal strength is the estimated signal strength associated with the signal strength $S^2(t)_{LP}$.

The front-end circuit 13 comprises an in-phase digital-analog converter (DAC) I-DAC, an in-phase low pass filter I-LPF, an in-phase mixer I-MIX, a quadrature DAC Q-DAC, a quadrature low pass filter Q-LPF, a quadrature mixer Q-MIX, an in-phase and quadrature phase locked loop circuit IQ-PLL, an I/Q combiner COMB, an IF band pass filter IF-BPF, an IF mixer IF-MIX and an IF phase locked loop circuit IF-PLL. The in-phase DAC I-DAC, the in-phase low pass filter I-LPF and the in-phase mixer I-MIX form the I channel of the front-end circuit 13, and the quadrature DAC Q-DAC, the quadrature low pass filter Q-LPF and the quadrature mixer Q-MIX form the Q channel of the front-end circuit 13.

The in-phase DAC I-DAC is electrically connected to the I/Q imbalance calibrator 12 to receive the signal I'(n) and perform the digital-analog conversion on the signal I'(n). The in-phase low pass filter I-LPF is electrically connected to the in-phase DAC I-DAC to perform the low pass filtering on the output signal of the in-phase DAC I-DAC. The in-phase mixer I-MIX is electrically connected to the in-phase low pass filter I-LPF and the in-phase and quadrature phase locked loop circuit IQ-PLL, and used to mix the output signal of the in-phase low pass filter I-LPF and an in-phase LO signal from the in-phase and quadrature phase locked loop circuit IQ-PLL.

The quadrature DAC Q-DAC is electrically connected to the I/Q imbalance calibrator 12 to receive the signal Q'(n) and perform the digital-analog conversion on the signal Q'(n). The quadrature low pass filter Q-LPF is electrically connected to the quadrature DAC Q-DAC to perform the low pass filtering on the output signal of the quadrature DAC Q-DAC. The quadrature mixer Q-MIX is electrically connected to the quadrature low pass filter Q-LPF and the in-phase and quadrature phase locked loop circuit IQ-PLL, and used to mix the output signal of the quadrature low pass filter Q-LPF and a quadrature LO signal from the in-phase and quadrature phase locked loop circuit IQ-PLL.

The I/Q combiner COMB is electrically connected to the in-phase and quadrature mixers I-MIX, Q-MIX, and used to perform the in-phase and quadrature signal combination on the output signals of the in-phase and quadrature mixers I-MIX, Q-MIX, so as to output the signal S(t). The I/Q combiner COMB is for example a subtractor (i.e. the signal S(t) is the subtraction of the output signals of the in-phase and quadrature mixers I-MIX, Q-MIX), and the present disclosure is not limited thereto.

The IF band pass filter IF-BPF is electrically connected to the I/Q combiner COMB to perform the band pass filtering on the signal S(t). The IF mixer IF-MIX is electrically connected to the IF band pass filter IF-BPF and the IF phase locked loop circuit IF-PLL, and used to mix the output signal of the IF band pass filter IF-BPF and an IF signal from the IF phase locked loop circuit IF-PLL to generate the radio frequency signal RF(t).

The signal strength acquiring circuit 14 comprise a square calculation circuit SQ and a square signal low pass filter SQ-LPF. The square calculation circuit SQ is electrically connected to the I/Q combiner COMB to perform the square calculation on the signal S(t) to generate a signal $S^2(t)$. The square signal low pass filter SQ-LPF is electrically connected to square calculation circuit SQ to perform the low pass filtering on the signal $S^2(t)$ to generate the signal strength $S^2(t)_{LP}$.

The I/Q imbalance estimator 15 comprises a controller CTRL and a delta estimator 151. The delta estimator 151 is electrically connected to the square signal low pass filter SQ-LPF, and to estimate the signal strength $S^2(t)_{LP}$ by using the delta estimation. The controller CTRL is electrically connected to the delta estimator 151, the calibration signal generator 111 and the I/Q imbalance calibrator 12, so as to control the calibration signal generator 111 and transmit the I/Q gain and phase imbalances to the I/Q imbalance calibrator 12.

Specifically, in the I/Q imbalance calibration mode, firstly, the calibration signal generator 111 is controlled to transmits merely the first in-phase calibration signal (assuming it is A*cos(w*n)) to the I/Q imbalance calibrator 12, and that is I(n)=A*cos(w*n), Q(n)=0, wherein n is a discrete time variable, A is amplitude, and w is a radial frequency. The I/Q imbalance calibrator 12 now has not received the I/Q gain and phase imbalances, and thus I/Q imbalance calibrator 12 bypasses the signals I(n), Q(n), i.e. I'(n)=I(n), and Q'(n)=Q(n).

After the signals I'(n) and Q'(n) are processed by the front-end circuit 13, the signal strength $S^2(t)_{LP}$ related to the first in-phase calibration signal is output to the delta estimator 151. The controller CRTL thus obtains the estimated signal strength related to the first in-phase calibration signal by using the delta estimator 151.

Next, the calibration signal generator 111 is controlled to transmits merely the first quadrature calibration signal (assuming it is A*cos(w*n)) to the I/Q imbalance calibrator 12, and that is I(n)=0, Q(n)=A*cos(w*n). The I/Q imbalance calibrator 12 now has not received the I/Q gain and phase imbalance, and thus I/Q imbalance calibrator 12 bypasses the signals I(n), Q(n), i.e. I'(n)=I(n), and Q'(n)=Q(n).

After the signals I'(n) and Q'(n) are processed by the front-end circuit 13, the signal strength $S^2(t)_{LP}$ related to the first quadrature calibration signal is output to the delta estimator 151. The controller CRTL thus obtains the estimated signal strength related to the first quadrature calibration signal by using the delta estimator 151. The controller CTRL can calculate the I/Q gain imbalance according to the estimated signal strengths respectively related to the first in-phase and quadrature calibration signals.

Next, the calibration signal generator 111 is controlled to transmits merely the first in-phase calibration signal (assuming it is A*cos(w*n)) to the I/Q imbalance calibrator 12, and that is I(n)=A*cos(w*n), Q(n)=0. The I/Q imbalance calibrator 12 now has received the I/Q gain imbalance, and thus I/Q imbalance calibrator 12 performs the I/Q gain imbalance compensation on the signals I(n), Q(n), i.e. the signal I'(n) is a second in-phase calibration signal which is generated by performing the I/Q gain imbalance compensation on the first in-phase calibration signal.

After the signals I'(n) and Q'(n) are processed by the front-end circuit 13, the signal strength $S^2(t)_{LP}$ related to the second in-phase calibration signal is output to the delta estimator 151. The controller CRTL thus obtains the estimated signal strength related to the second in-phase calibration signal by using the delta estimator 151.

Next, the calibration signal generator 111 is controlled to transmits both of the first in-phase and quadrature calibration signals (assuming they are A*cos(w*n)) to the I/Q imbalance calibrator 12, and that is I(n)=A*cos(w*n), Q(n)= A*cos(w*n). The I/Q imbalance calibrator 12 now has received the I/Q gain imbalance, and thus I/Q imbalance calibrator 12 performs the I/Q gain imbalance compensation on the signals I(n), Q(n), i.e. the signal I'(n) is a second in-phase calibration signal which is generated by performing the I/Q gain imbalance compensation on the first in-phase calibration signal, and the signal Q'(n) is a second quadrature calibration signal which is generated by performing the I/Q gain imbalance compensation on the first quadrature calibration signal.

After the signals I'(n) and Q'(n) are processed by the front-end circuit 13, the signal strength $S^2(t)_{LP}$ related to the second in-phase and quadrature calibration signals is output to the delta estimator 151. The controller CRTL thus obtains the estimated signal strength related to the second in-phase and quadrature calibration signals by using the delta estimator 151. The controller CTRL can calculate the I/Q phase imbalance according to the estimated signal strength related to the second in-phase calibration signal and the estimated signal strength related to both of the second in-phase and quadrature calibration signals.

In addition, details of the delta estimator 151 are illustrated as follows. The delta estimator 151 comprises a comparator COMP, an adder ACC-ADD, a delay unit D and a DAC DAC-1. The comparator COMP has a positive input end electrically connected to the square signal low pass filter SQ-LPF and a negative input end electrically connected to the DAC DAC-1, and compares the signal strength $S^2(t)_{LP}$ and the reference signal strength output by the DAC DAC-1.

The adder ACC-ADD is electrically connected to the delay unit D and an output end of the comparator COMP, and the adder ACC-ADD adds the output signal of the comparator COMP and the output signal of the delay unit D. The delay unit D is electrically connected to the controller CTRL to be triggered by a clock signal REG-CLK, so as to delays an accumulated signal ACC(n) generated by the adder ACC-ADD. The DAC DAC-1 is connected to the controller to be triggered by a clock signal DAC-CLK, so as to perform a digital-analog conversion on an accumulated data signal DAC-DATA(n) related to the accumulated signal ACC(n) to generate the reference signal strength.

It is noted that the delta estimation is used without ADC. In addition, the DAC DAC-1 does not need to have the ultra-high sampling rate, such that the power consumption, hardware complexity and cost can be reduced.

Figure 2:
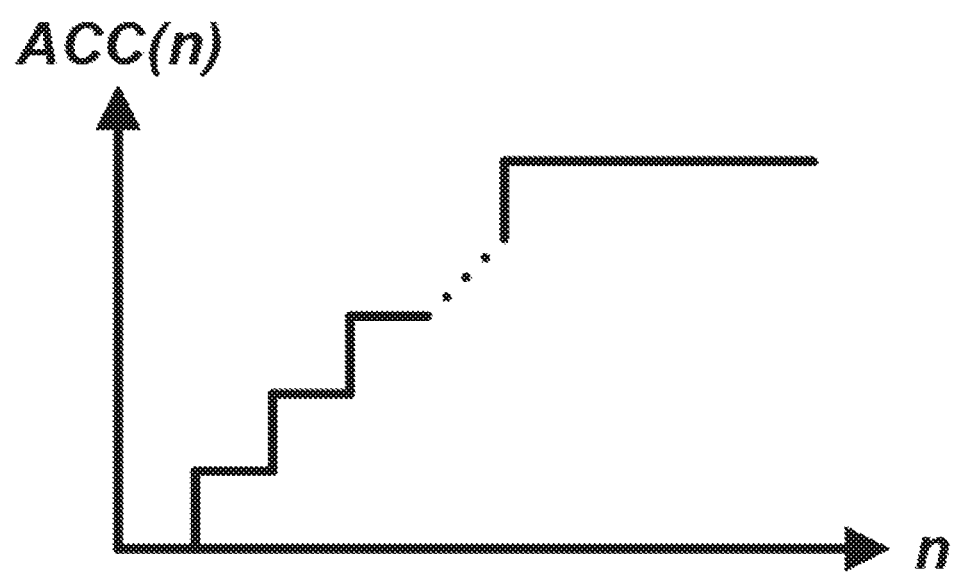
FIG. 2 is an oscillograph of an accumulated signal according one embodiment of the present disclosure.

The comparators COMP output a delta signal when the reference signal strength is less than the signal strength $S^2(t)_{LP}$, and the comparators COMP output zero when the reference signal strength is not less than the signal strength $S^2(t)_{LP}$. Referring to FIG. 1 and FIG. 2, FIG. 2 is an oscillograph of an accumulated signal according one embodiment of the present disclosure. Accordingly, the accumulated signal ACC(n) is saturated when the reference signal strength (or the accumulated signal ACC(n)) is approximate to and not less than the signal strength $S^2(t)_{LP}$, and the reference signal strength (or the accumulated signal ACC(n)) will not increment, such that the reference signal strength (or the accumulated data signal DAC-DATA(n)) can be the estimated signal strength associated with the signal strength $S^2(t)_{LP}$.

Figure 3:
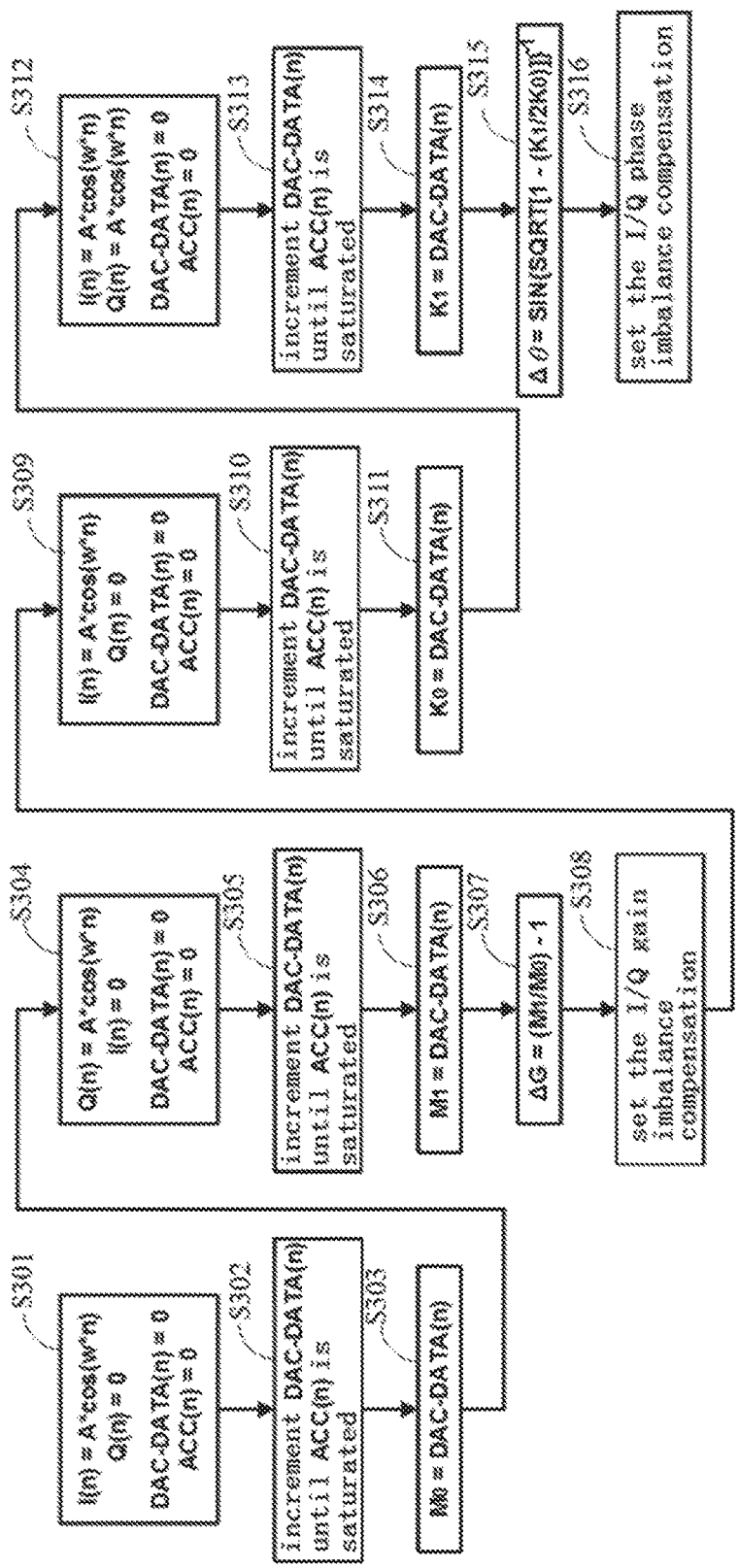
FIG. 3 is a flow chart of an I/Q imbalance calibration method according to one embodiment of the present disclosure.

Next, refereeing to FIG. 1 and FIG. 3, FIG. 3 is a flow chart of an I/Q imbalance calibration method according to one embodiment of the present disclosure. The I/Q imbalance calibration method is executed in the I/Q imbalance calibration mode. At step S301, the accumulated signal AAC(n) and the accumulated data signal DAC-DATA(n) are initialized (i.e. DAC-DATA(n)=0, ACC(n)=0), merely the first in-phase calibration signal (i.e. I(n)=A*cos(w*n), Q(n)= 0) is processed with the digital-analog conversion, the low pass filtering and the in-phase LO signal mixing by the I channel of the front-end circuit 13, and then is processed with the I/Q combination by the front-end circuit 13 to generate a first calibration signal (i.e. the signal S(t) is the first calibration signal). Still at step S301, the first calibration signal is processed with the square calculation and the low pass filtering by the signal strength acquiring circuit 14 to obtain a first calibration signal strength (i.e. the signal strength $S^2(t)_{LP}$ is the first calibration signal strength).

Then at step S302, the I/Q imbalance estimator 15 is used to estimate the first calibration signal strength by using the delta estimation, and that is, the accumulated data signal DAC-DATA(n) is gradually incremented until the accumulated signal ACC(n) is saturated as shown in FIG. 2. Then, at step S303, the controller CTRL records the estimated first calibration signal strength or the accumulated data signal corresponding to the estimated first calibration signal strength (i.e. $M_0$=DAC-DATA(n)).

Next, at step S304, the accumulated signal AAC(n) and the accumulated data signal DAC-DATA(n) are initialized (i.e. DAC-DATA(n)=0, ACC(n)=0), merely the first quadrature calibration signal (i.e. I(n)=0, Q(n)=A*cos(w*n)) is processed with the digital-analog conversion, the low pass filtering and the quadrature LO signal mixing by the Q channel of the front-end circuit 13, and then is processed with the I/Q combination by the front-end circuit 13 to generate a second calibration signal (i.e. the signal S(t) is the second calibration signal). Still at step S304, the second calibration signal is processed with the square calculation and the low pass filtering by the signal strength acquiring circuit 14 to obtain a second calibration signal strength (i.e. the signal strength $S^2(t)_{LP}$ is the second calibration signal strength).

Then at step S305, the I/Q imbalance estimator 305 is used to estimate the second calibration signal strength by using the delta estimation, and that is, the accumulated data signal DAC-DATA(n) is gradually increment until the accumulated signal ACC(n) is saturated as shown in FIG. 2. Then, at step S306, the controller CTRL records the estimated second calibration signal strength or the accumulated data signal corresponding to the estimated second calibration signal strength (i.e. $M_1$=DAC-DATA(n)).

Next, at step S307, the controller CTRL determines the I/Q gain imbalance ($\Delta G$) according to the estimated first and second calibration signal strengths (or the accumulated data signals corresponding to the estimated first and second calibration signal strengths), and that is, $\Delta G$=SQRT($M_1$/$M_0$)-1. Next, at step S308, the I/Q gain imbalance is transmitted to the I/Q imbalance calibrator 12, and thus the I/Q imbalance calibrator 12 can set the I/Q gain imbalance compensation based upon the received I/Q gain imbalance. It is noted that the executed order of steps "S301 through S303" and the executed order of steps "304 through 306" can be exchanged, and the present disclosure is not limited thereto; or alternatively, merely steps S301 and S304 can be exchanged, and the equation in step S307 should be modified to $\Delta G$=SQRT($M_0$/$M_1$)-1.

Next, at step S309, the accumulated signal AAC(n) and the accumulated data signal DAC-DATA(n) are initialized (i.e. DAC-DATA(n)=0, ACC(n)=0), merely the first in-phase calibration signal (i.e. I(n)=A*cos(w*n), Q(n)=0) is compensated with the I/Q gain imbalance compensation by the I/Q imbalance calibrator 12 to generate the second in-phase calibration signal to the I channel of the front-end circuit 13, the second in-phase calibration signal is processed with the digital-analog conversion, the low pass filtering and the in-phase LO signal mixing by the I channel of the front-end circuit 13, and then is processed with the I/Q combination by the front-end circuit 13 to generate a third calibration signal (i.e. the signal S(t) is the third calibration signal). Still at step S309, the third calibration signal is processed with the square calculation and the low pass filtering by the signal strength acquiring circuit 14 to obtain a third calibration signal strength (i.e. the signal strength $S^2(t)_{LP}$ is the third calibration signal strength).

Then at step S310, the I/Q imbalance estimator 303 is used to estimate the third calibration signal strength by using the delta estimation, and that is, the accumulated data signal DAC-DATA(n) is gradually incremented until the accumulated signal ACC(n) is saturated as shown in FIG. 2. Then, at step S311, the controller CTRL records the estimated third calibration signal strength or the accumulated data signal corresponding to the estimated third calibration signal strength (i.e. $K_0$=DAC-DATA(n)).

Next, at step S312, the accumulated signal AAC(n) and the accumulated data signal DAC-DATA(n) are initialized (i.e. DAC-DATA(n)=0, ACC(n)=0), both of the second in-phase and quadrature calibration signals (i.e. I(n)=A*cos(w*n), Q(n)=A*cos(w*n)) are compensated with the I/Q gain imbalance compensation by the I/Q imbalance calibrator 12 to generate the second in-phase and quadrature calibration signals to the I and Q channels of the front-end circuit 13, the second in-phase calibration signal is processed with the digital-analog conversion, the low pass filtering and the in-phase LO signal mixing by the I channel of the front-end circuit 13, the second quadrature calibration signal is processed with the digital-analog conversion, the low pass filtering and the quadrature LO signal mixing by the Q channel of the front-end circuit 13, and then both of the processed signals are processed with the I/Q combination by the front-end circuit 13 to generate a fourth calibration signal (i.e. the signal S(t) is the third calibration signal).

Still at step S312, the fourth calibration signal is processed with the square calculation and the low pass filtering by the signal strength acquiring circuit 14 to obtain a fourth calibration signal strength (i.e. the signal strength $S^2(t)_{LP}$ is the fourth calibration signal strength).

Then at step S313, the I/Q imbalance estimator 15 is used to estimate the fourth calibration signal strength by using the delta estimation, and that is, the accumulated data signal DAC-DATA(n) is gradually incremented until the accumulated signal ACC(n) is saturated as shown in FIG. 2. Then, at step S314, the controller CTRL records the estimated fourth calibration signal strength or the accumulated data signal corresponding to the estimated fourth calibration signal strength (i.e. $K_1$=DAC-DATA(n)).

Next, at step S315, the controller CTRL determines the I/Q phase imbalance (AO) according to the estimated third and fourth calibration signal strengths (or the accumulated data signals corresponding to the estimated third and fourth calibration signal strengths), and that is, $\Delta\theta=\sin^{-1}\{[1-(K_1/2K_0)]\}$. Next, at step S316, the I/Q phase imbalance is transmitted to the I/Q imbalance calibrator 12, and thus the I/Q imbalance calibrator 12 can set the I/Q phase imbalance compensation based upon the received I/Q phase imbalance. It is noted that the executed order of steps "S309 through S311" and the executed order of steps "312 through 314" can be exchanged, and the present disclosure is not limited thereto; or alternatively, merely steps S309 and S312 can be exchanged, and the equation in step S307 should be modified to $\Delta\theta=\sin^{-1}\{[1-(K_0/2K_1)]\}$.

In conclusion, the provided I/Q imbalance calibration apparatus and method do not need the ultra-high sampling rate ADC, and thus the cost, the power consumption and hardware complexity can be reduced. Furthermore, the transmitter system using the provided I/Q imbalance calibration apparatus and method can adopt the communication band of the millimeter wave.

While the present disclosure has been described by means of specific embodiments, numerous modifications and variations could be made thereto by those skilled in the art without departing from the scope and spirit of the present disclosure set forth in the claims.

What is claimed is:

1. An I/Q (In-Phase and Quadrature) imbalance calibration apparatus utilized in a transmitter system operated in an I/Q imbalance calibration mode, comprising:
   a calibration signal generator, configured to selectively generate a first in-phase calibration signal, a first quadrature calibration signal, or both of the first in-phase and quadrature calibration signals;
   an I/Q imbalance calibrator, electrically connected to the calibration signal generator, configured to perform an I/Q gain imbalance compensation on the first in-phase and quadrature calibration signals to generate a second in-phase and quadrature calibration signals after receiving an I/Q gain imbalance, and selectively output the first in-phase calibration signal, the first quadrature calibration signal, the second in-phase calibration signal, or both of the second in-phase and quadrature calibration signals to a front-end circuit of the transmitter system;
   a signal strength acquiring circuit, electrically connected to the front-end circuit of the transmitter system, configured to selectively acquire and output one of a first through fourth calibration signal strengths, wherein the first through fourth calibration signal strengths are corresponding to a first through fourth calibration signals respectively, and the first through fourth calibration signals are processed signals which the front-end circuit processes the first in-phase calibration signal, the first quadrature calibration signal, the second in-phase calibration signal and both of the second in-phase and quadrature calibration signals respectively; and an I/Q imbalance estimator, electrically connected to the signal strength acquiring circuit, configured to selectively estimate one of the first through fourth calibration signal strengths by a delta estimation, calculate the I/Q gain imbalance according to an estimated first and second calibration signal strengths, calculate an I/Q phase imbalance according to an estimated third and fourth calibration signal strengths;

wherein the signal strength acquiring circuit comprises:

a square calculation circuit, electrically connected to the front-end circuit, configured to perform a square calculation on received one of the first through fourth calibration signals; and a low pass filter, electrically connected to the square calculation circuit and the I/Q imbalance estimator, configured to perform low pass filtering on squared one of the first through fourth calibration signals, to generate one of the first through fourth calibration signal strengths;

wherein the I/Q imbalance estimator comprises:

a delta estimator, electrically connected to the signal strength acquiring circuit, configured to generate a reference signal strength according to an accumulated data signal, compare the reference signal strength with one of the first through fourth calibration signal strengths, and the accumulated data signal is gradually incremented until the reference signal strength is approximate to and not less than the one of the first through fourth calibration signal strengths; and a controller, electrically connected to the delta estimator, the I/Q imbalance calibrator and the calibration signal generator, configured to calculate the I/Q gain imbalance according to the estimated first and second calibration signal strengths, calculate the I/Q phase imbalance according to the estimated third and fourth calibration signal strengths.

2. The I/Q imbalance calibration apparatus according to claim 1, wherein a calculation of the I/Q phase imbalance is performed after a calculation of the I/Q gain imbalance, the I/Q gain imbalance is transmitted to the I/Q imbalance calibrator to set an I/Q gain imbalance compensation after the I/Q gain imbalance is calculated, and the I/Q phase imbalance is transmitted to the I/Q imbalance calibrator to set an I/Q phase imbalance compensation after the I/Q phase imbalance is calculated.

3. The I/Q imbalance calibration apparatus according to claim 1, wherein the delta estimator comprises:

a DAC (Digital to Analog Converter), electrically connected to the controller, configured to receive the accumulated data signal generated from the controller according to an accumulated signal, and the DAC is triggered by a first clock signal from the controller to perform digital-analog conversion on the accumulated data signal to generate the reference signal strength;

a comparator, electrically connected to signal strength acquiring circuit and the DAC, configured to compare the reference signal strength with one of the first through fourth calibration signal strengths, output a delta signal when the reference signal strength is less than the one of the first through fourth calibration signal strengths, and output zero when the reference signal strength is not less than the one of the first through fourth calibration signal strengths;

a delay unit; and an adder, electrically connected to the delay unit and the comparator, wherein the delay unit is triggered by a second clock signal from the controller to delay the accumulated signal output from the adder, and the adder adds an output signal of the delay unit and an output signal of the comparator to generate the accumulated signal.

4. The I/Q imbalance calibration apparatus according to claim 1, wherein an accumulated data signal corresponding to the estimated first calibration signal strength is denoted as $M_0$, an accumulated data signal corresponding to the estimated second calibration signal strength is denoted as $M_1$, the I/Q gain imbalance is denoted as $\Delta G$, and $\Delta G = \text{SQRT}(M_1/M_0) - 1$; wherein an accumulated data signal corresponding to the estimated third calibration signal strength is denoted as $K_0$, an accumulated data signal corresponding to the estimated fourth calibration signal strength is denoted as $K_1$, the I/Q phase imbalance is denoted as $\Delta\theta$, and $\Delta\theta = \sin^{-1}\{[1-(K_1/2K_0)]\}$.

5. A transmitter system, comprises:

a baseband transmitter, having a calibration signal generator, in an I/Q (In-Phase and Quadrature) balance calibration mode, the calibration signal generator is configured to selectively generate a first in-phase calibration signal, a first quadrature calibration signal, or both of the first in-phase and quadrature calibration signals;

an I/Q imbalance calibrator, electrically connected to the calibration signal generator, in the I/Q balance calibration mode, configured to perform an I/Q gain imbalance compensation on the first in-phase and quadrature calibration signals to generate a second in-phase and quadrature calibration signals after receiving an I/Q gain imbalance, and selectively output the first in-phase calibration signal, the first quadrature calibration signal, the second in-phase calibration signal, or both of the second in-phase and quadrature calibration signals;

a front-end circuit, electrically connected to the I/Q imbalance calibrator, in the I/Q balance calibration mode, configured to selectively receive and process the first in-phase calibration signal, the first quadrature calibration signal, the second in-phase calibration signal, or both of the second in-phase and quadrature calibration signals to correspondingly generate one of a first through fourth calibration signals;

a signal strength acquiring circuit, electrically connected to the front-end circuit of the transmitter system, in the I/Q balance calibration mode, configured to selectively acquire and output one of a first through fourth calibration signal strengths, wherein the first through fourth calibration signal strengths are corresponding to the first through fourth calibration signals respectively; and an I/Q imbalance estimator, electrically connected to the signal strength acquiring circuit, in the I/Q balance calibration mode, configured to selectively estimate one of the first through fourth calibration signal strengths by a delta estimation, calculate the I/Q gain imbalance according to an estimated first and second calibration signal strengths, calculate an I/Q phase imbalance according to an estimated third and fourth calibration signal strengths;

wherein the signal strength acquiring circuit comprises:
a square calculation circuit, electrically connected to the front-end circuit, configured to perform a square calculation on received one of the first through fourth calibration signals; and
a low pass filter, electrically connected to the square calculation circuit and the I/Q imbalance estimator, configured to perform low pass filtering on squared one of the first through fourth calibration signals, to generate one of the first through fourth calibration signal strengths;

wherein the I/Q imbalance estimator comprises:
a delta estimator, electrically connected to the signal strength acquiring circuit, configured to generate a reference signal strength according to an accumulated data signal, compare the reference signal strength with one of the first through fourth calibration signal strengths, and the accumulated data signal is gradually incremented until the reference signal strength is approximate to and not less than the one of the first through fourth calibration signal strengths; and
a controller, electrically connected to the delta estimator, the I/Q imbalance calibrator and the calibration signal generator, configured to calculate the I/Q gain imbalance according to the estimated first and second calibration signal strengths, calculate the I/Q phase imbalance according to the estimated third and fourth calibration signal strengths.

6. The transmitter system according to claim 5, wherein a calculation of the I/Q phase imbalance is performed after a calculation of the I/Q gain imbalance, the I/Q gain imbalance is transmitted to the I/Q imbalance calibrator to set an I/Q gain imbalance compensation after the I/Q gain imbalance is calculated, and the I/Q phase imbalance is transmitted to the I/Q imbalance calibrator to set an I/Q phase imbalance compensation after the I/Q phase imbalance is calculated.

7. The transmitter system according to claim 5, wherein the delta estimator comprises:
a DAC (Digital to Analog Converter), electrically connected to the controller, configured to receive the accumulated data signal generated from the controller according to an accumulated signal, and the DAC is triggered by a first clock signal from the controller to perform digital-analog conversion on the accumulated data signal to generate the reference signal strength;
a comparator, electrically connected to signal strength acquiring circuit and the DAC, configured to compare the reference signal strength with one of the first through fourth calibration signal strengths, output a delta signal when the reference signal strength is less than the one of the first through fourth calibration signal strengths, and output zero when the reference signal strength is not less than the one of the first through fourth calibration signal strengths;
a delay unit; and
an adder, electrically connected to the delay unit and the comparator, wherein the delay unit is triggered by a second clock signal from the controller to delay the accumulated signal output from the adder, and the adder adds an output signal of the delay unit and an output signal of the comparator to generate the accumulated signal.

8. The transmitter system according to claim 5, wherein an accumulated data signal corresponding to the estimated first calibration signal strength is denoted as $M_0$, an accumulated data signal corresponding to the estimated second calibration signal strength is denoted as $M_1$, the I/Q gain imbalance is denoted as $\Delta G$, and $\Delta G = \mathrm{SQRT}(M_1/M_0) - 1$; wherein an accumulated data signal corresponding to the estimated third calibration signal strength is denoted as $K_0$, an accumulated data signal corresponding to the estimated fourth calibration signal strength is denoted as $K_1$, the I/Q phase imbalance is denoted as $\Delta \theta$, and $\Delta \theta = \sin^{-1}\{[1 - (K_1/2K_0)]\}$.

9. The transmitter system according to claim 5, wherein the front-end circuit is selectively configured to:
process the first in-phase calibration signal with a digital-analog conversion, low pass filtering and in-phase LO (Local Oscillator) signal mixing in an I channel, and then process output signals of the I channel and a Q channel with I/Q combination, to generate the first calibration signal;
process the first quadrature calibration signal with a digital-analog conversion, low pass filtering and quadrature LO signal mixing in a Q channel, and then process output signals of the I and Q channels with I/Q combination, to generate the second calibration signal;
process the second in-phase calibration signal with the digital-analog conversion, the low pass filtering and the in-phase LO signal mixing in the I channel, and then process the output signals of the I and Q channels with I/Q combination, to generate the third calibration signal; or
process the second in-phase calibration signal with the digital-analog conversion, the low pass filtering and the in-phase LO signal mixing in the I channel, process the second quadrature calibration signal with the digital-analog conversion, the low pass filtering and the quadrature LO signal mixing in the Q channel, and then process the output signals of the I and Q channels with I/Q combination, to generate the fourth calibration signal.

10. The transmitter system according to claim 9, wherein in a normal mode, the baseband transmitter transmits in-phase and quadrature data signals to the I/Q balance calibrator, the I/Q balance calibrator outputs calibrated in-phase and quadrature data signals to the front-end circuit, and the front-end circuit processes the calibrated in-phase data signal with the digital-analog conversion, the low pass filtering and the in-phase LO signal mixing in the I channel, processes the calibrated quadrature data signal with the digital-analog conversion, the low pass filtering and the quadrature LO signal mixing in the Q channel, then processes the output signals of the I and Q channels with I/Q combination, to generate a combination signal, and then further processes the combination signal with band pass filtering and IF signal mixing to generate a radio frequency signal.

11. The transmitter system according to claim 5, wherein the transmitter system adopts a communication band of a millimeter wave.

12. An I/Q imbalance (In-Phase and Quadrature) calibration method utilized in a transmitter system operated in an I/Q imbalance calibration mode, comprising:
inputting a first in-phase calibration signal to a front-end circuit of the transmitter system to generate a first calibration signal, acquiring a first calibration signal strength, and estimating the first calibration signal strength by utilizing a delta estimation;
inputting a first quadrature calibration signal to the front-end circuit of the transmitter system to generate a second calibration signal, acquiring a second calibration signal strength, and estimating the second calibration signal strength by utilizing the delta estimation;

calculating an I/Q gain imbalance according to the estimated first and second calibration signal strengths;

inputting a second in-phase calibration signal to the front-end circuit of the transmitter system to generate a third calibration signal, acquiring a third calibration signal strength, and estimating the third calibration signal strength by utilizing the delta estimation, wherein an I/Q gain imbalance compensation is formed on the first in-phase calibration signal to generate the second in-phase calibration signal;

inputting both of the second in-phase calibration signal and second quadrature calibration signal to the front-end circuit of the transmitter system to generate a fourth calibration signal, acquiring a fourth calibration signal strength, and estimating the fourth calibration signal strength by utilizing the delta estimation, wherein the I/Q gain imbalance compensation is formed on the first quadrature calibration signal to generate the second quadrature calibration signal; and calculating an I/Q phase imbalance according to the estimated third and fourth calibration signal strengths;

wherein a square calculation is performed on received one of the first through fourth calibration signals, and a low pass filtering is performed on squared one of the first through fourth calibration signals, to generate one of the first through fourth calibration signal strengths;

wherein a reference signal strength is generated according to an accumulated data signal, the reference signal strength is compared with one of the first through fourth calibration signal strengths, and the accumulated data signal is gradually incremented until the reference signal strength is approximate to and not less than the one of the first through fourth calibration signal strengths.

13. The I/Q imbalance calibration method according to claim 12, further comprising: setting an I/Q gain imbalance compensation according to the I/Q gain imbalance; and setting an I/Q phase imbalance compensation according to the I/Q gain imbalance wherein a calculation of the I/Q phase imbalance is performed after a calculation of the I/Q gain imbalance.

14. The I/Q imbalance calibration method according to claim 12, wherein an accumulated data signal corresponding to the estimated first calibration signal strength is denoted as $M_0$, an accumulated data signal corresponding to the estimated second calibration signal strength is denoted as $M_1$, the I/Q gain imbalance is denoted as $\Delta G$, and $\Delta G = \mathrm{SQRT}(M_1/M_0) - 1$; wherein an accumulated data signal corresponding to the estimated third calibration signal strength is denoted as $K_0$, an accumulated data signal corresponding to the estimated fourth calibration signal strength is denoted as $K_1$, the I/Q phase imbalance is denoted as $\Delta\theta$, and $\Delta\theta = \sin^{-1}\{[1-(K_1/2K_0)]\}$.

* * * * *